(12) United States Patent
Farnworth (10) Patent No.: US 6,172,413 B1
(45) Date of Patent: Jan. 9, 2001

(54) CHIP LEADS CONSTRAINED IN DIELECTRIC MEDIA

(75) Inventor: Warren M. Farnworth, Nampa, ID (US)

(73) Assignee: Micron Technology, Inc., Boise, ID (US)

(*) Notice: Under 35 U.S.C. 154(b), the term of this patent shall be extended for 0 days.

(21) Appl. No.: 08/948,120

(22) Filed: Oct. 9, 1997

(51) Int. Cl.[7] .................. H01L 23/495; H01L 23/48; H01L 23/52

(52) U.S. Cl. .................. 257/666; 257/48; 257/674; 257/676; 257/672; 257/671; 257/692

(58) Field of Search .................. 257/666, 48, 674, 257/676, 672, 671, 692–697, 787

(56) References Cited

U.S. PATENT DOCUMENTS

| | | | |
|---|---|---|---|
| 4,542,259 | 9/1985 | Butt | 174/52 |
| 5,025,307 | * 6/1991 | Ueda et al. | 257/692 |
| 5,369,059 | 11/1994 | Eberlein | 437/213 |
| 5,444,304 | 8/1995 | Hara et al. | 257/796 |
| 5,550,323 | * 8/1996 | Gainey | 257/692 |
| 5,557,145 | * 9/1996 | Kobayashi et al. | 257/692 |
| 5,635,760 | * 6/1997 | Ishikawa | 257/692 |
| 5,737,191 | * 4/1998 | Horiuchi et al. | 361/764 |
| 5,763,940 | * 6/1998 | Shibusawa et al. | 257/668 |
| 5,926,696 | * 7/1999 | Baxter et al. | 438/118 |

FOREIGN PATENT DOCUMENTS 7-142668 * 6/1992 (JP) ........................ 257/692

* cited by examiner

Primary Examiner—Mahshid Saadat
Assistant Examiner—Jhihan B Clark
(74) Attorney, Agent, or Firm—Workman, Nydegger & Seeley

(57) ABSTRACT

The present invention relates to a chip package and to methods of testing a chip package wherein contact to chip leads is made by a configuration of testing probes in such a manner so as to allow for shorter, tighter-pitch, and more robust chip leads that will not short out into neighboring adjacent chip leads. The present invention also relates to a chip package wherein the terminal ends of the chip leads are constrained in a dielectric medium such that package testing may be carried out before final sizing of chip lead lengths.

25 Claims, 11 Drawing Sheets

CHIP LEADS CONSTRAINED IN DIELECTRIC MEDIA

BACKGROUND OF THE INVENTION

1. The Field of the Invention

The present invention relates to packaging and testing of microchips. More particularly, the present invention relates to methods of packaging a microchip for testing prior to mounting the microchip upon a circuit board. Additionally, the present invention relates to methods of testing a packaged microchip that has a tight lead pitch. In particular, the present invention relates to a method of packaging and testing a microchip with a tight lead pitch, wherein the testing method uses a probe and allows for removal of that portion of the lead which made contact with the probe, thus providing a shorter lead length.

2. The Relevant Technology

Microelectronic devices, such as semiconductor devices, are usually packaged on a lead frame structure to permit interconnection with a larger system. Often, the lead frame structures are connected to a printed circuit board (PCB) which, in turn, is connected to a larger electronic system such as a computer or other device.

After fabrication of a semiconductor integrated circuit, the integrated circuit is put through a die sort procedure. Each individual die is electrically tested for electrical performance and proper circuit functioning. During a die sort procedure, the integrated circuit is mounted on a vacuum chuck and aligned to thin electrical probes that contact each of the bonding pads on the die. The probes are connected to power supplies that test the circuit and record the results. Dies which do not pass the die sort are eliminated from the processing line. Dies which pass the die sort are singulated as chips and packaged into semiconductor device packages. The packaged semiconductor devices may then be re-tested prior to a final test and shipment.

As high integration and higher processing speeds of semiconductor devices have been improved, miniaturization and increased reliability of electronic devices has also been pursued. Along with miniaturization of circuits, miniaturization of chip packages has been a goal. That is, improvements have been necessary for coping with the needs for miniaturization of the packages, for achieving higher processing speeds of the semiconductor devices, and for achieving multiple-pin devices with increasingly narrower pitches.

In such packaging technology of semiconductor devices, chip mounting has progressed from through-hole mounting on a PCB to surface mounting on one side of the PCB. For example, in packaging plastic, especially in order to improve the mounting density upon a PCB, there has been proposed a vertical surface mounted package (VSMP). In the VSMP, a package is mounted perpendicularly on a surface of a PCB and, thus, the surface mounting technology can be applied to the chip package.

With packaging miniaturization, there occur accompanying problems. One problem is that when a VSMP is to be mounted on a board, mounting has to be substantially precise. Substantially imprecise mounting can cause leads to be bent, misaligned, or can cause solder bridges to form therebetween. Any significantly improper board mounting leads to device failure.

Testing of chip packages with tight-pitch leads is problematic because testing probes may have a characteristic diameter, such as a width, that may be greater than the width of a lead plus the space on either side thereof. Although testing probes of smaller dimensions are manufacturable, they add a significant increase to costs. Additionally, testing probes often tend to damage the portion of a lead upon which the probe makes contact. When such damage occurs, the lead must be reformed, commonly called "spanking" the lead. Although lead spanking or other reforming operations can in many cases reshape the lead after testing, it is an additional processing step and yield can decrease.

Lead length is also an important part of the overall semiconductor device. A reduced lead length allows for such advantages as a lower inductance, a higher speed, and a lower capacitance and a smaller package. As lead dimensions continue to decrease in size, fabrication of a robust lead that stands up to necessary testing procedures becomes a greater challenge.

What is needed in the art is a method of testing a chip in a chip package that allows for lower cost including larger diameter testing probes that have a characteristic dimension that is greater than the lead width. What is also needed in the art is a reduced lead length in a chip package that is produced without the processing of lead spanking or similar reforming operations. What is also needed in the art is a method of testing a chip in a package wherein incidental damage of any kind to the contacted portion of the lead is inconsequential to the final chip package to be used in the field.

SUMMARY OF THE INVENTION

The present invention relates to a chip package and to methods of testing a chip package wherein contact is made by a configuration of testing leads in such a manner so as to allow for shorter and tighter-pitch leads than those used in the prior art or with contacts of the prior art that are robust, but that will not short out by contact with neighboring adjacent leads. The invention contemplated uses in a variety of chip packaging including ring pack, VSMP, zig-zag surface-mounted packages, and dual in-line surface-mounted packages.

During testing of a chip package, a testing device such as a test head with an array of pogo pins is used. In one embodiment of the chip package, an array of leads are provided. Upon at least one of the leads, a first contact location is found proximate to the chip package. Distal to the first contact location, a second contact location is found. Substantially at or near the lead terminal end, a third contact location is found. Where testing uses a contact such as a pogo pin, a contact cross-sectional footprint will be made upon the lead. The contact cross-sectional footprint has a characteristic dimension. The characteristic dimension may be greater than the width of the lead. The characteristic dimension is less than the sum of the width of the lead and twice the distance between a given lead and an immediate adjacent lead.

Where a lead pitch of 0.75 mm or smaller is to be used in a chip package, a conventional pogo pin will typically have a characteristic dimension such that staggering of the first contact location, the second contact location, and the third contact location, etc. allows for a more robust and less expensive pogo pin to be used without causing shorting of any given pogo pin by contact with an immediately adjacent pogo pin or bridging of a pogo pin between two adjacent occurrences of a lead.

In another embodiment, a contact cross-sectional footprint is imposed upon a lead at a first contact location and a second side contact cross-sectional footprint is imposed beneath a lead at a second contact location. In this embodiment, contact of the array of leads from alternatingly opposite sides facilitates closer packing of the pogo pin with adjacent, same lead-side pogo pins by alternating pogo pins to make contact with a given lead from a first side and with the immediately adjacent lead from a second side. In another embodiment, a testing configuration features the contact cross-sectional footprint and second side contact cross-sectional footprint overlapping each other when viewed in plan view with the footprints depicted in cross-section.

An inventive structure of the present invention includes an array of leads, whereby the array of leads is constrained by a dielectric material. Because the array of leads is constrained in a dielectric material and is not shorted out into an electrically conductive material, testing of a chip package by making contact with the constrained leads with a probe such as a pogo pin can be carried out, whereby destructive bending of any lead is resisted by virtue of the constraining dielectric material.

A two-sided contact testing scheme is another embodiment according to the present invention wherein a pogo pin makes contact with a constrained lead from above a chip package, and another pogo pin makes contact with a second constrained lead from below the chip package.

In another embodiment of the present invention, contact with an array of leads is carried out with a test head and a probe comprising a contact on film. A contact on film comprises a flexible film that swings down from a test head, a trace that is electrically conductive and that runs within the flexible film, a contact bump that is electrically connected to the trace, and a resilient member that allows for variance in individual positions of each of the leads in an array of leads.

The contact bump may have such geometrically angular shapes as a cube, a pyramid, a tetrahedron, a truncated pyramid, a truncated tetrahedron, and the like. The contact bump may have such geometrically curvilinear shapes as a sphere, an eccentric sphere, a hemisphere, an eccentric hemisphere, and the like. The contact bump may be of such mixed angular and curvilinear shapes as a cone, a frusto-cone, and the like.

After testing of a chip package, a sacrificial portion of a lead is removed preferably while the lead remains constrained in a dielectric material. Where a chip package has passed testing within certain parameters that are acceptable such as to a sufficiently low inductance, a sufficiently high speed, and a sufficiently low capacitance, removal of the sacrificial portion will provide a greater margin or acceptability after testing.

In another embodiment of the present invention, a chip package has an array of leads extending therefrom. Each lead has a width and is separated by a distance from at least one other of the leads. In this embodiment a dual array of testing probes, such as a pogo pin, make contact with the array of leads from a first side and from a second side. Although each of the contact cross-sectional footprints and contact cross-sectional footprint from the second side substantially overlap more than one lead, in this embodiment the contact such as pogo pin has a tapered tip. The tapered tip of the contact may have a shape as set forth above such as angular and/or curvilinear configurations. The substantial surface area of the tip of the contact has a width that may be less than that of the lead, but not greater than the width of the lead plus twice the spacing on either side.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Reference will now be made to the drawings wherein like structures will be provided with like reference designations. It is to be understood that the drawings are diagrammatic and schematic representations of the embodiment of the present invention and are not drawn to scale.

The present invention relates to a chip package and to methods of testing a chip package wherein contact is made by a configuration of testing leads in such a manner so as to allow for shorter and tighter-pitch leads than those used in the prior art or with contacts of the prior art that are robust, but that will not short out into neighboring adjacent leads.

Figure 1:
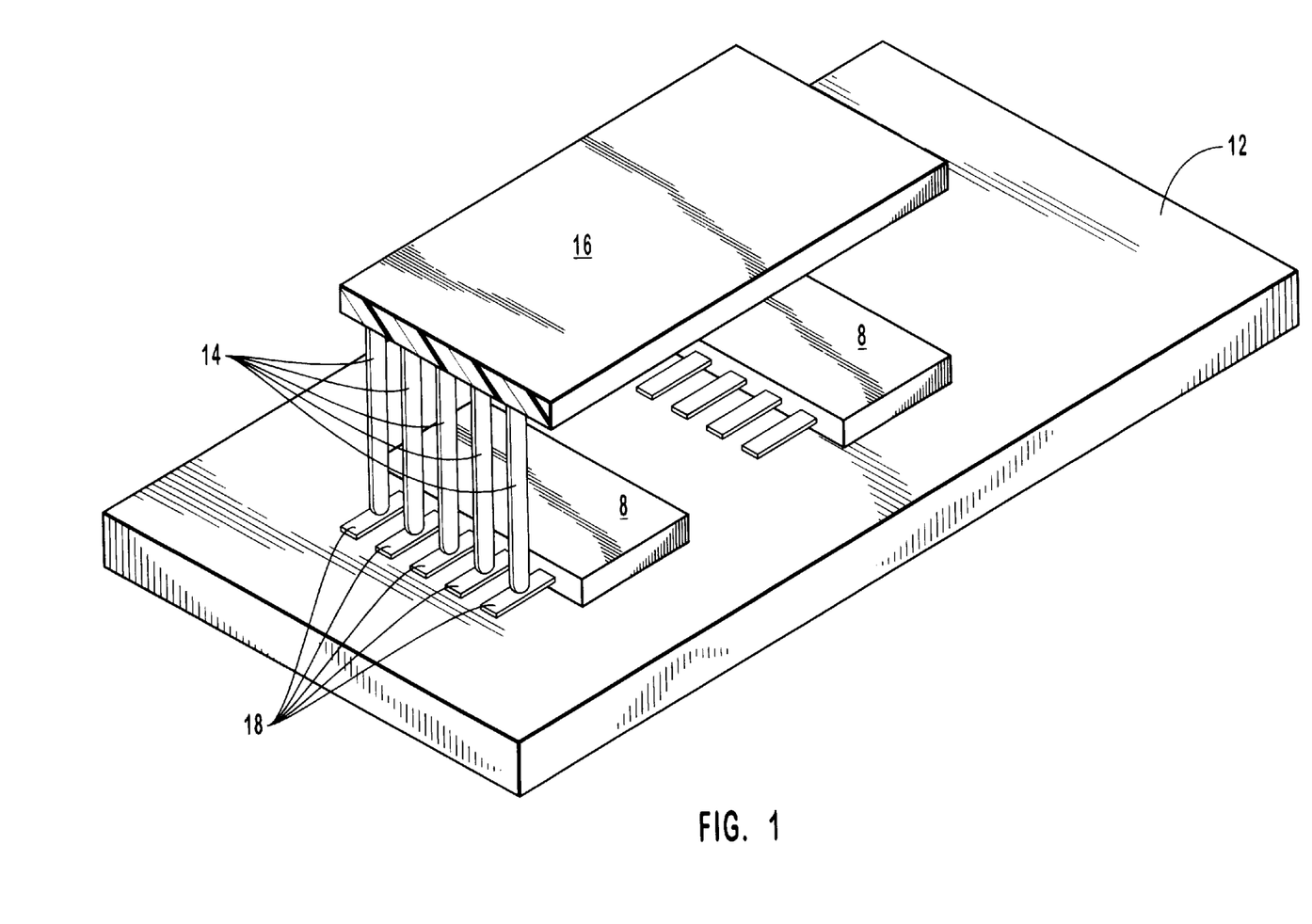
FIG. 1 is an elevational oblique view of an array of chip packages in a handling tray each of which is being tested by making contact with a test head through a pogo pin.

FIG. 1 is an elevational oblique view of testing of an array of a chip package 8. It is intended that chip package 8 seen in FIG. 1 be representative of a variety of chip packaging including ring pack, VSMP, zig-zag surface-mounted packages, and dual in-line surface-mounted packages. Chip package 8 rests upon a handling tray 12 and a testing device comprising a test head 16 and in this embodiment, an array of pogo pins 14 making contact with a corresponding array of free leads 18.

Figure 2:
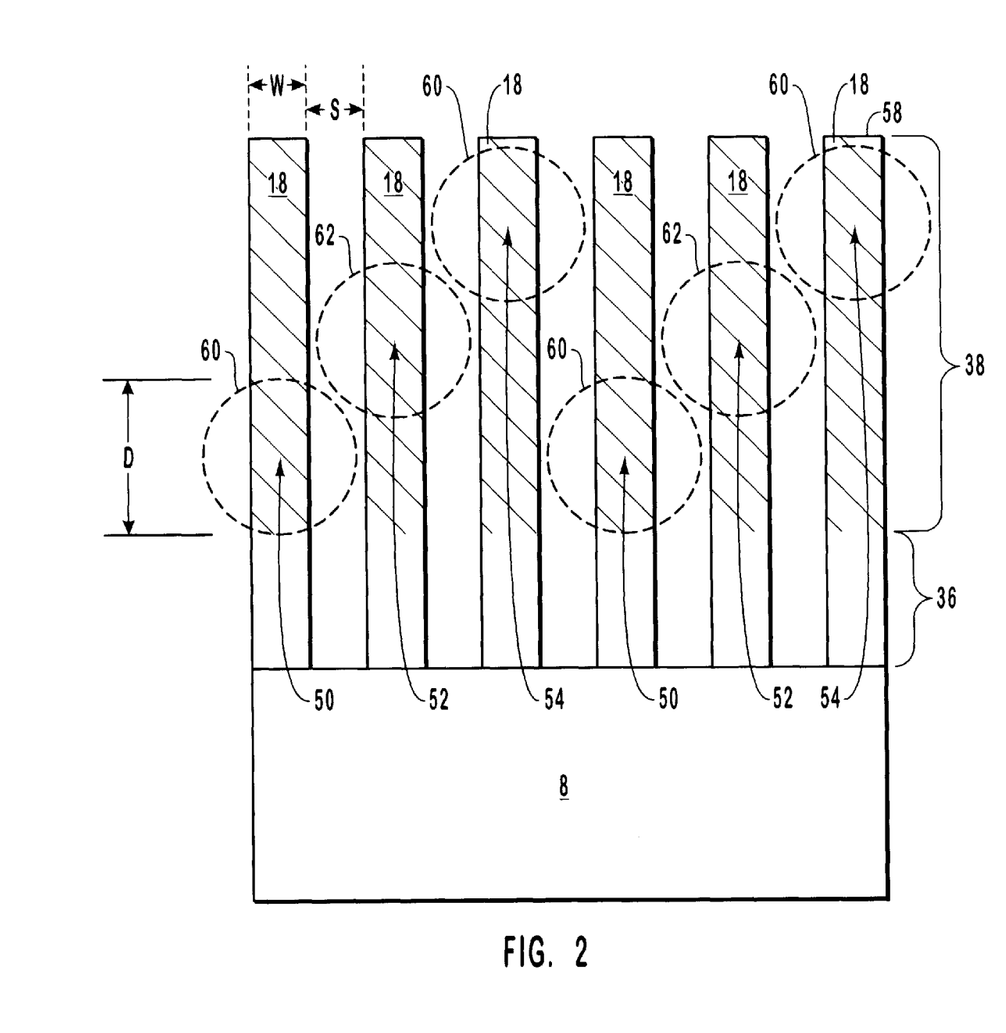
FIG. 2 is a plan view illustration of one embodiment of the present invention, wherein contact points along adjacent leads are staggered after a manner that allows for pogo pins having a larger characteristic dimension than the width of the lead.

Details of contact patterns of the array of pogo pin 14 upon the array of free leads 18 are depicted in FIG. 2. In FIG. 2, it can be seen that chip package 8 has an array of free leads 18, in this section, six of free leads 18, each lead having a lead proximal first end 56 that emerges from chip package 8 and a lead terminal second end 58 that is distal from chip package 8.

During testing of chip package 8, a testing device such as test head 16 with an array of pogo pins 14, seen in FIG. 1, is used. In the embodiment of chip package depicted in FIG. 2, six free leads 18 are provided. Upon two of free leads 18, a first contact location 50 is found proximate chip package 8. Distal to first contact location 50, a second contact location 52 is found. Substantially at or near lead terminal second end 58, a third contact location 54 is found. Where testing uses a contact such as pogo pin 14, a contact cross-Page sectional footprint 60, illustrated as a dashed-line circle, will be made upon free lead 18. It can be seen that contact cross-sectional footprint 60 has a characteristic dimension D. Characteristic dimension D may be greater than the width W of free lead 18. In this embodiment as illustrated, characteristic dimension D is less than the sum of width W of free lead 18 and twice the distance S between a given free lead 18 and an immediate adjacent free lead 18.

Where a lead pitch of 0.75 mm or smaller is to be used in chip package 8, a conventional pogo pin 14 will typically have characteristic dimension D, as illustrated in FIG. 2. Staggering of first contact location 50, second contact location 52, and third contact location 54, etc. allows for a more robust and less expensive pogo pin to be used. Such an arrangement can be made without causing shorting of any given pogo pin 14 into an immediately adjacent pogo pin 14 or bridging of pogo pin 14 between two adjacent occurrences of free lead 18. A conventional robust pogo pin has a characteristic dimension in cross section that is substantially circular and is in a size range from about 50 mils to about 35 mils. Closest packing of an array of pogo pins 14 is achieved by considering the closest distance between the center of two leads to be about one-half the characteristic dimension, but where the two leads do not make electrical contact. Thus, the cross-sectional distance between the characteristic center of two adjacent leads is substantially equal to $(2W^2+4WS+2S^2)^{1/2}$.

Figure 3:
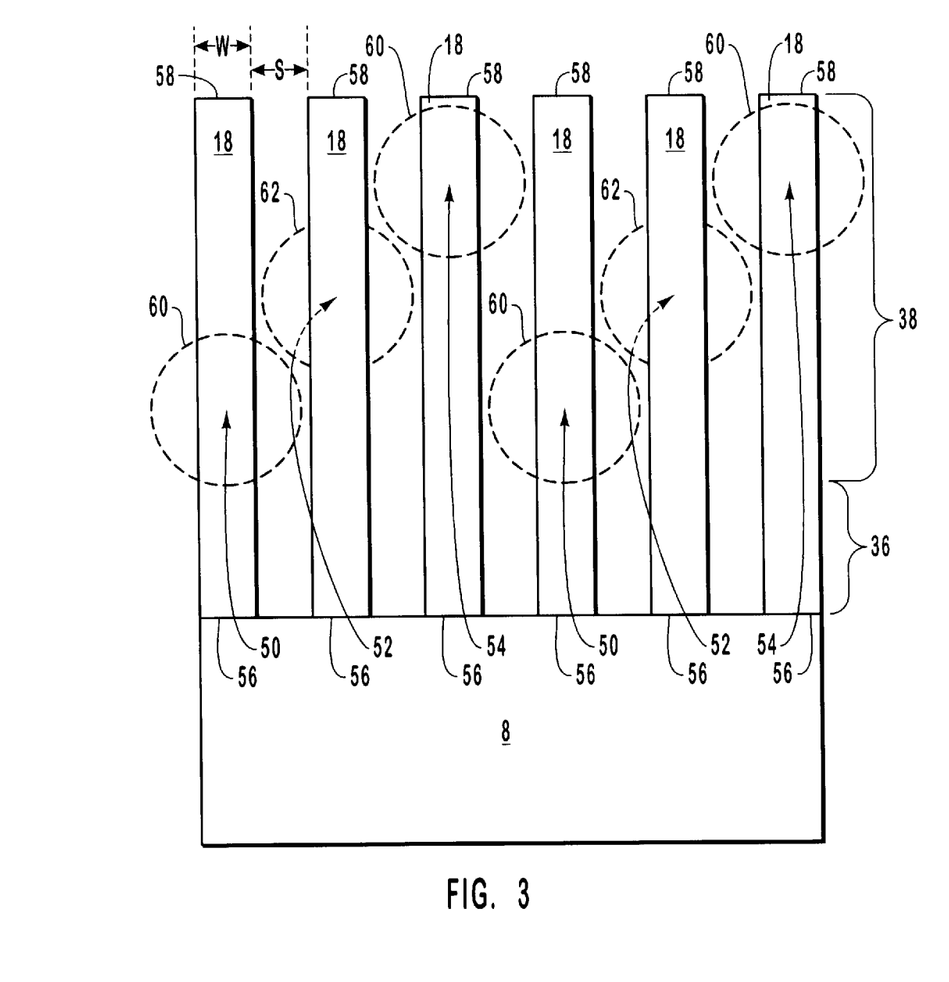
FIG. 3 is a plan view illustration of one embodiment of the present invention, wherein an alternative scheme of contacting leads with pogo pins is carried out whereby contact with a first lead is made upon a first side and contact with an adjacent second lead is made upon a second side that is opposite to the first side, etc.

FIG. 3 is another embodiment of the present invention, wherein chip package 8 is arrayed with six (6) of free leads 18. Each of free lead 18 has a width Wand is separated from at least one other of free lead 18 by distance S. Each of free lead 18 has lead proximal first end 56 and lead terminal second end 58. It can be seen that contact cross-sectional footprint 60 is imposed upon free lead 18 at first contact location 50 and that a second side contact cross-sectional footprint 62 is imposed beneath free lead 18 at second contact location 52. In this embodiment, contact of the array of free lead 18 from alternatingly opposite sides facilitates closer packing of pogo pin 14 with adjacent, same lead-side pogo pins. The closer packing is accomplished by alternating pogo pins to make contact with a given free lead 18 from a first side and with the immediately adjacent free lead from a second side. Although contact cross-sectional footprint 60 and second side contact cross-sectional footprint 62 are not illustrated as overlapping with each other, it is understood that such a testing configuration wherein contact cross-sectional footprint 60 and second side contact cross-sectional footprint 62 overlap thereof is one embodiment of the present invention. Where pogo pin 14 has a tapered tip such as a frusto-conical shape, the first side array and second side array of pogo pin 14 may not only overlap with each other, but each array may also be staggered along the length of free lead 18 for a denser configuration to accommodate an even tighter pitch.

Figure 4:
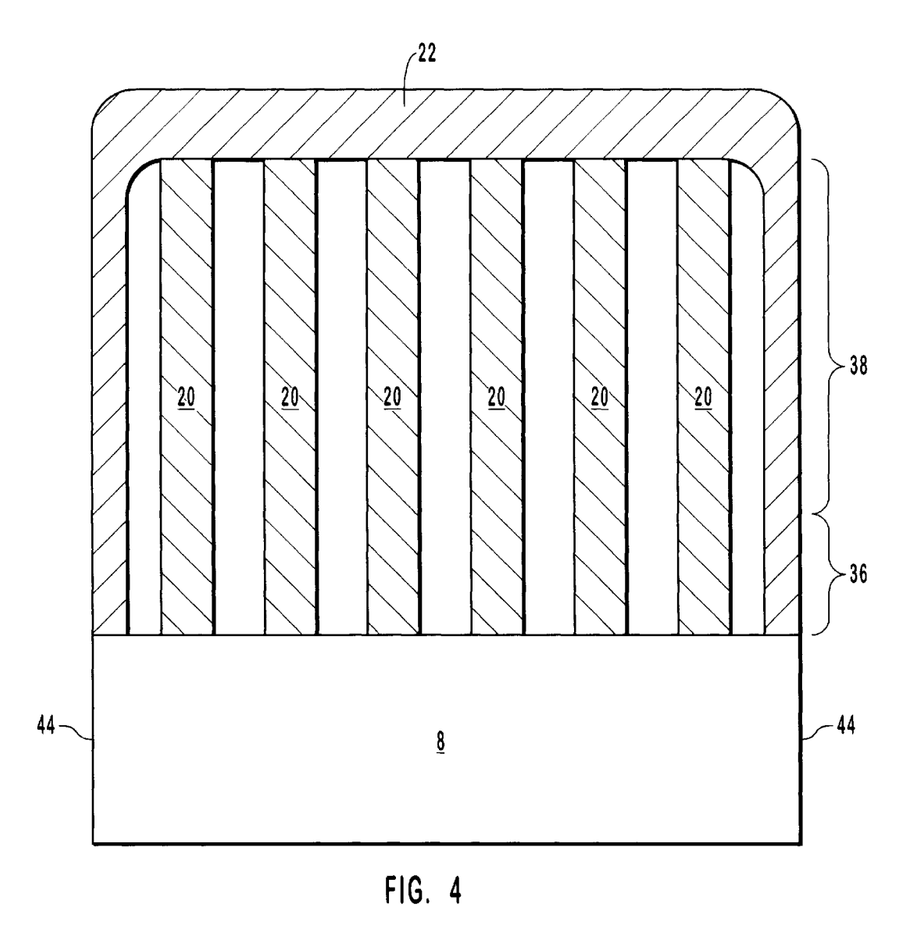
FIG. 4 is a plan view of one embodiment of the present invention in which a chip package has an array of leads that are constrained in a dielectric material, and wherein a portion of the leads is to be contacted by testing implements.
Figure 5:
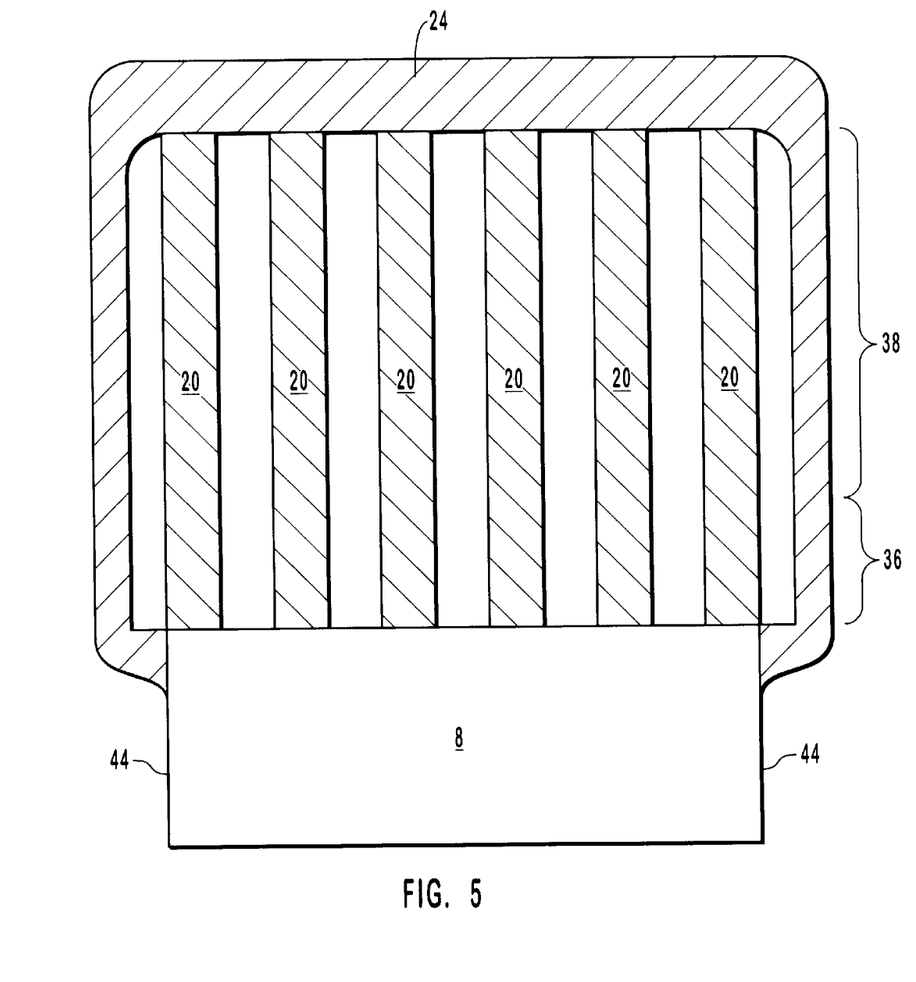
FIG. 5 is a plan view of one embodiment of the present invention in which a chip package has an array of leads extending from the chip package that are constrained in a dielectric material similar to the embodiment depicted in FIG. 4, wherein the array of leads extends to the lateral edge of the chip package.

An inventive structure of the present invention is illustrated in FIG. 4, wherein chip package 8 includes an array of constrained leads 20, whereby each constrained lead 20 is constrained by a first dielectric constraint 22. First dielectric constraint 22 may be any suitable dielectric material. Preferred embodiments of first dielectric constraint 22 include materials that are amenable to chip package handling and testing environments such as thermoplastics, resins, polyamides, and polytetrafluoroethylene (PTFE). FIG. 5 is an alternative embodiment of this inventive structure, wherein a second dielectric constraint 24 forms a U-shape beyond a package lateral edge 44. Such an embodiment is usefull when each constrained lead 20 in its array begins at package lateral edge 44 as it extends from chip package 8. Because each constrained lead 20 is constrained in a dielectric material and not shorted out into an electrically conductive material, testing of chip package 8 by making contact with constrained lead 20 with a probe such as pogo pin 14 can be carried out whereby destructive bending of constrained lead 20 is resisted by virtue of first dielectric constraint 22 in FIG. 4 or by a second dielectric constraint 24 in FIG. 5 where the array of constrained leads 20 extends to the lateral edge of chip package 8.

Figure 6:
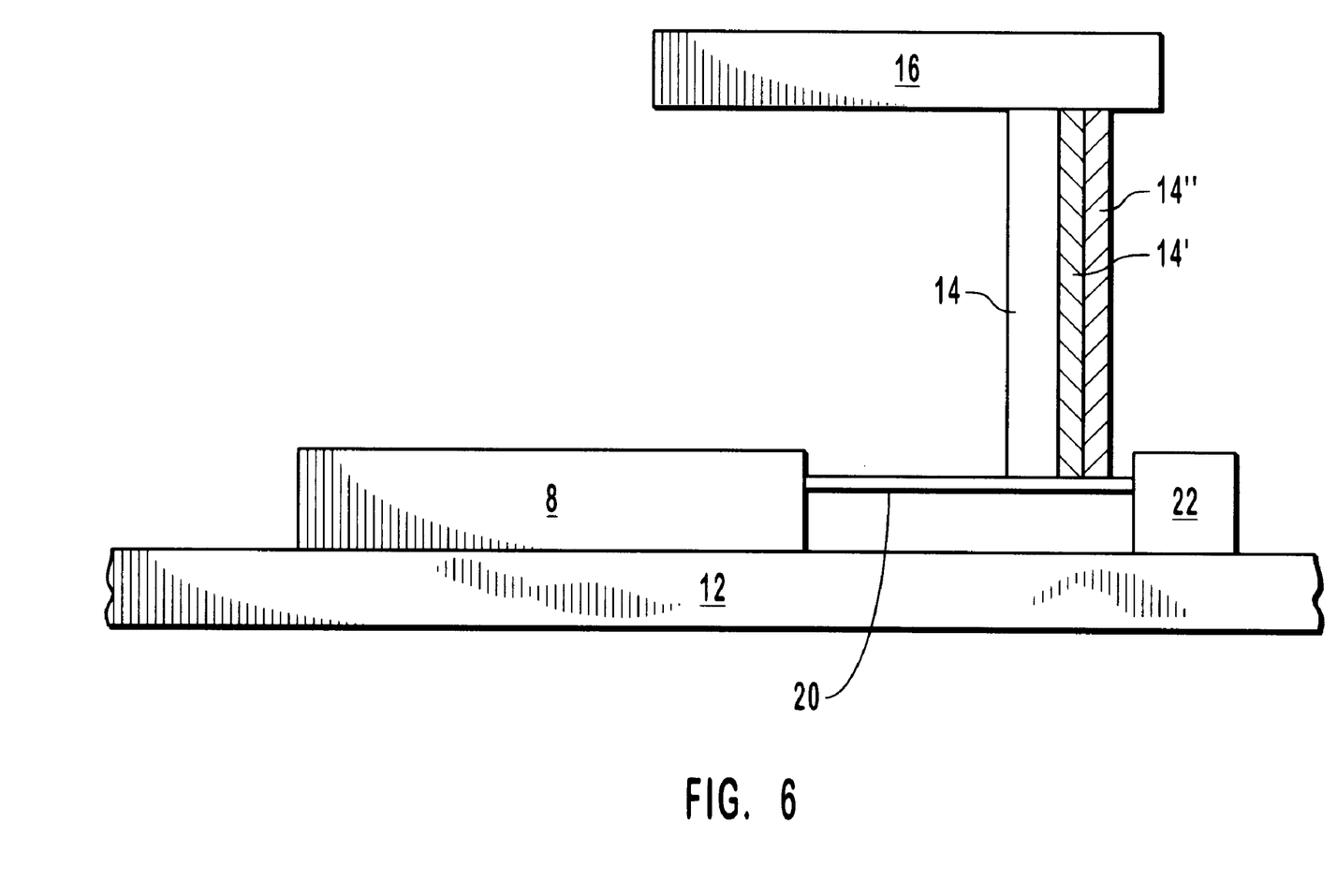
FIG. 6 is an elevational cross-section view of an embodiment of the present invention, wherein a chip package having an array of leads constrained in a dielectric material is being tested through a test head by making contact with the leads from a corresponding array of pogo pins.

FIG. 6 illustrates a one-sided testing scheme according to the present invention, wherein a test head 16 and pogo pin 14 make contact with constrained lead 20 that emerges from chip package 8 and is embedded in first dielectric constraint 22. Chip package 8 is held in a handling tray 12. Handling tray 12 may be raised whereby the array of constrained leads 20 makes contact with a corresponding array of pogo pins 14. Alternatively, test head 16 may be moved downwardly whereby the array of pogo pins 14 makes contact with the corresponding array of constrained leads 20. A first staggered pogo pin 14' and a second staggered pogo pin 14" is seen behind pogo pin 14, according to a configuration illustrated in FIG. 6.

Figure 7:
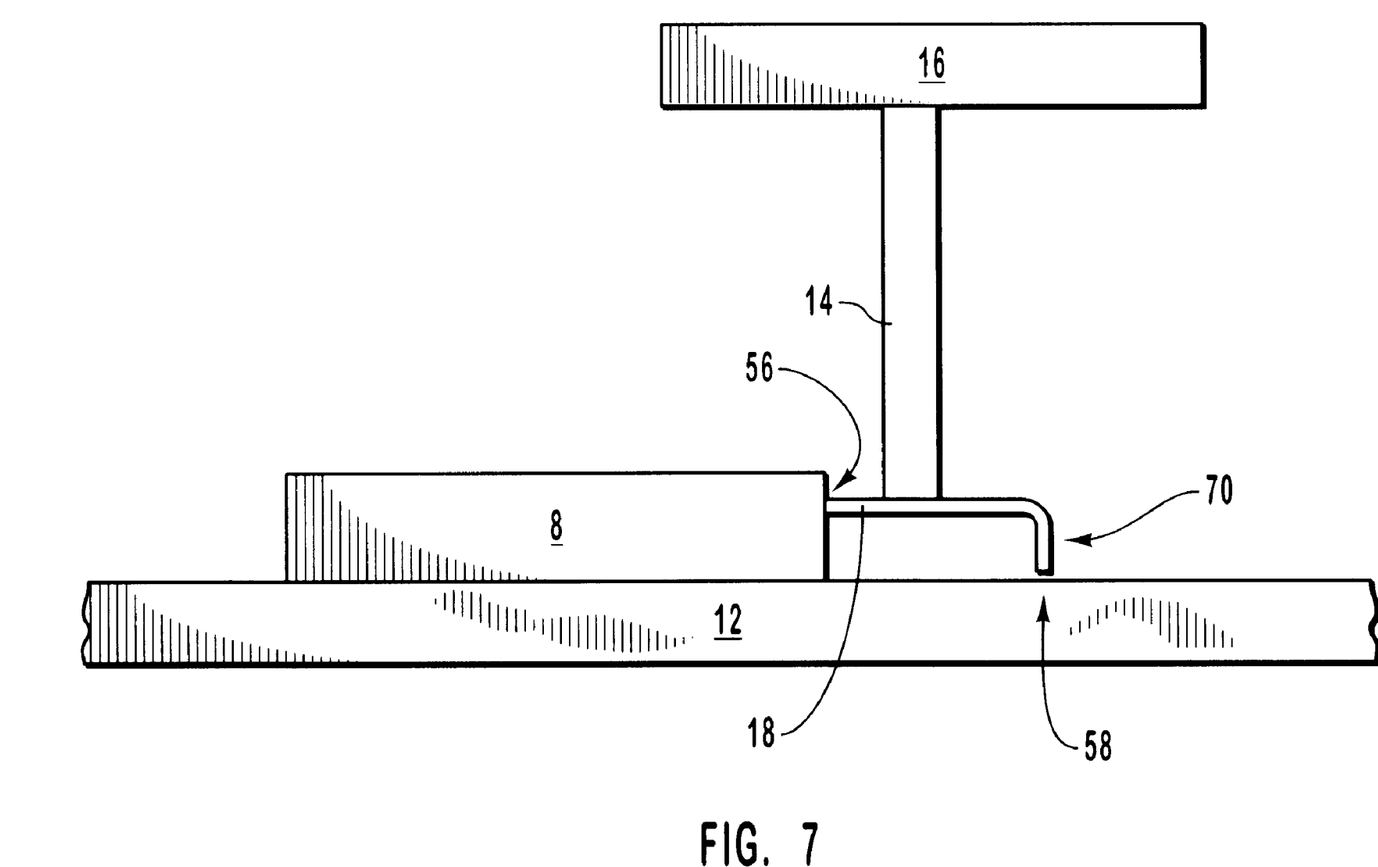
FIG. 7 is an elevational cross-section view of an embodiment of the present invention, wherein a chip package having an array of free leads is being tested with an array of pogo pins that is configured according to the inventive method.

FIG. 7 illustrates testing of chip package 8, wherein an array of free leads 18 emerges from chip package 8. Movement of handling tray 12 or test head 16 may be carried out as set forth above. In FIG. 7, the array of free leads 18 has been formed to have a substantially 90 degree bend. Between the 90 degree bend and lead terminal second end 58, free lead 18 forms a board mount portion 70 such as for a VSMP. Contacting the array of free leads 18 according to the inventive method comprises contacting according to the contacting schemes set forth above, upon that portion of free lead 18 between lead proximal first end 56 and the 90 degree bend.

Figure 8:
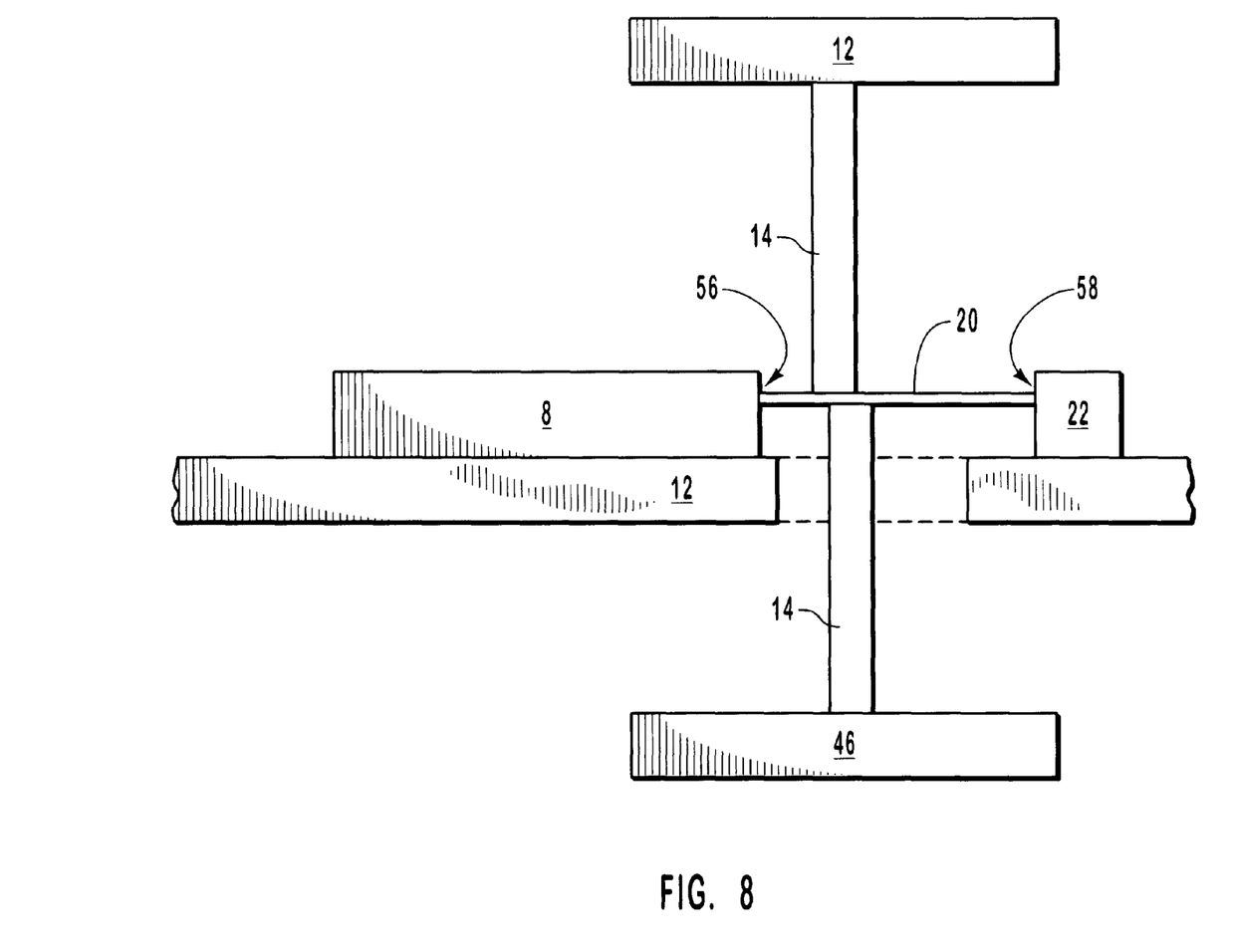
FIG. 8 is an elevational cross-section view of an embodiment of the present invention, wherein a chip package has an array of leads extending therefrom, the array of leads being constrained in a dielectric material, where the chip package is depicted as being tested with two test heads that have pogo pins extending therefrom, and where a test head is configured above the chip package and a second test head is configured below the chip package.

FIG. 8 illustrates a two-sided contact testing scheme according to the present invention. Pogo pin 14 makes contact with constrained lead 20 from above chip package 8. Another of pogo pin 14 makes contact with a second constrained lead 20 (not shown) that is not the same constrained lead as that being made contact to pogo pin 14 from below chip package 8. Test head 16 and a second test head 46 may configure individual arrays of pogo pins 14 such that contact with chip package 8 upon an array of either free leads 18 or constrained leads 20 may be carried out either in a pogo pin staggered configuration as illustrated in FIG. 3 or as a pogo pin in-line configuration (not illustrated), among others as herein disclosed.

Figure 9:
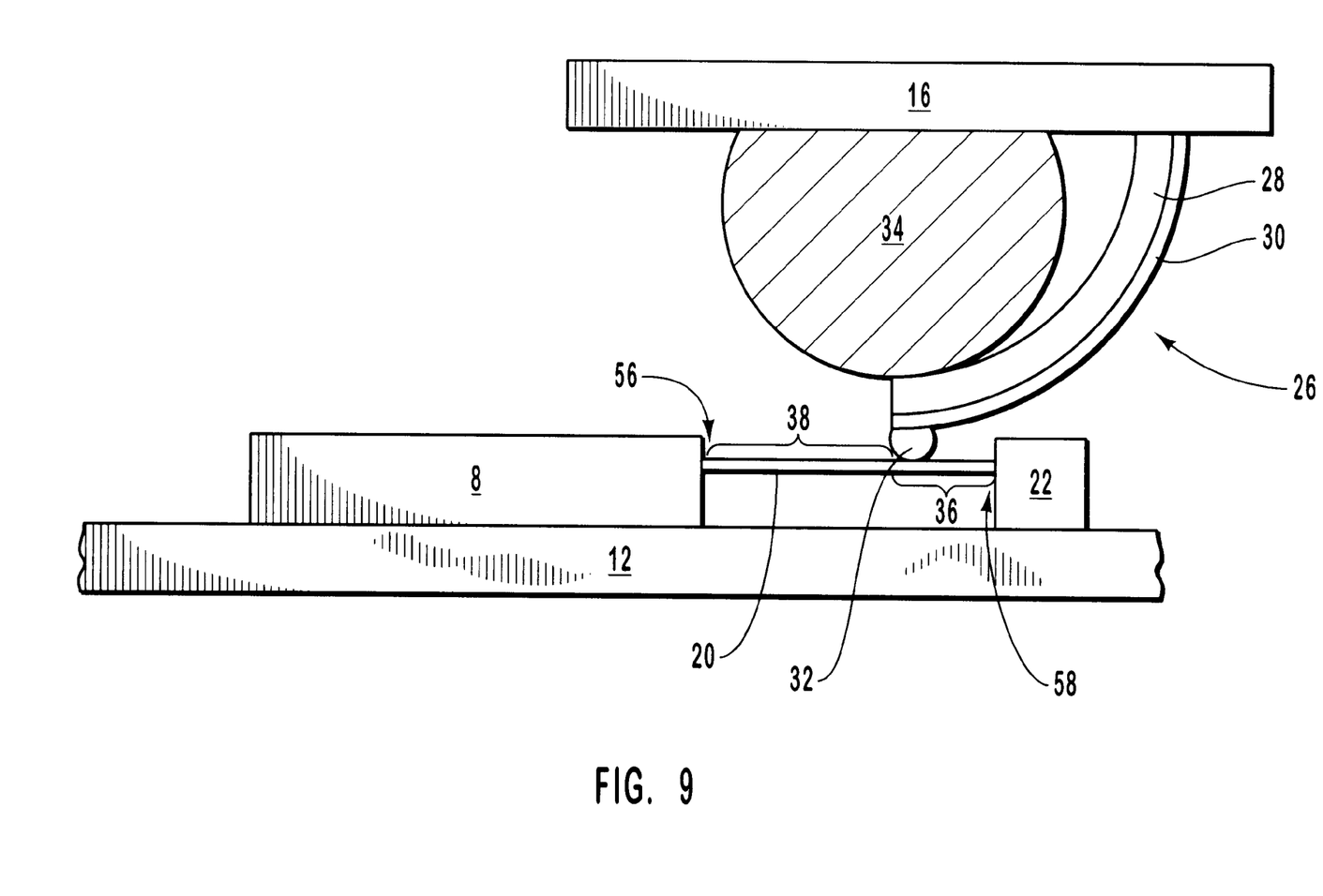
FIG. 9 is an elevational cross-section view of an embodiment of the present invention, wherein a chip package having an array of leads extending therefrom and being constrained in a dielectric material is being tested through a test head that is connected to the leads with a trace embedded in a flexible film, the trace being terminated with a contact bump.

Another embodiment of the present invention is seen in FIG. 9, where contact with an array of either free leads 18 or constrained leads 20 is carried out with test head 16 and a probe comprising a contact on film 26. Contact on film 26 comprises flexible film 28 that swings down from test head 16. A trace 30 that is electrically conductive runs with and is positioned within flexible film 28, and a contact bump 32 is electrically connected to trace 30. A resilient member 34 allows for variance in individual positions of each of the leads in an array of either free leads 18 or constrained leads 20. In FIG. 9, it can be seen that contact bump 32 makes contact with constrained lead 20.

Resilient member 34 allows contact bump 32 to make an electrical connection with test head 16, and the array of constrained leads 20, where individual height variance of constrained leads 20 may occur. Resilient member 34 has a hardness in the range from about 10 durometers to about 100 derometers, preferably from about 20 derometers to about 70 durometer, more preferably from about 30 derometers to about 40 derometers. Most preferably, resilient member 34 has a hardness of about 35 durometer.

Contact bump 32 may have such geometrically angular shapes to substantially form a cube, a pyramid, a tetrahedron, a truncated pyramid, a truncated tetrahedron, and the like. Contact bump 32 may have such geometrically curvilinear shapes to substantially form a sphere, an eccentric sphere, a hemisphere, an eccentric hemisphere, and the like. Contact bump 32 may be of such mixed angular and curvilinear shapes as a cone, a frusto-cone, and the like.

In FIGS. 4, 5, and 9 it can be seen that two portions of constrained lead 20 are delineated as a sacrificial portion 36 and a permanent portion 38. Although testing of constrained lead 20 is illustrated with contact on film 26, other testing may be carried out such as with pogo pins 14, a buckle beam, or the like. For example, a testing probe may be used such that sacrificial portion 36 of constrained lead 20 is substantially damaged. After sufficient testing of chip package 8, sacrificial portion 36 of constrained lead 20 is removed preferably while constrained lead 20 remains constrained in first dielectric constraint 22 or second dielectric constraint 24 as seen in FIG. 5. Where chip package 8 has passed testing within certain parameters that are acceptable such as to a sufficiently low inductance, a sufficiently high speed, and a sufficiently low capacitance, removal of sacrificial portion 36 will provide a greater margin or acceptability after testing. This greater margin occurs because, where the entire portion of coined lead 20 was used in the test, only permanent portion 38 of constrained lead 20 is put into field use. It is another embodiment of the present invention to remove sacrificial portion 36 from chip package 8 where free lead 18, seen in FIGS. 1–3 and 7, is used.

Figure 10:
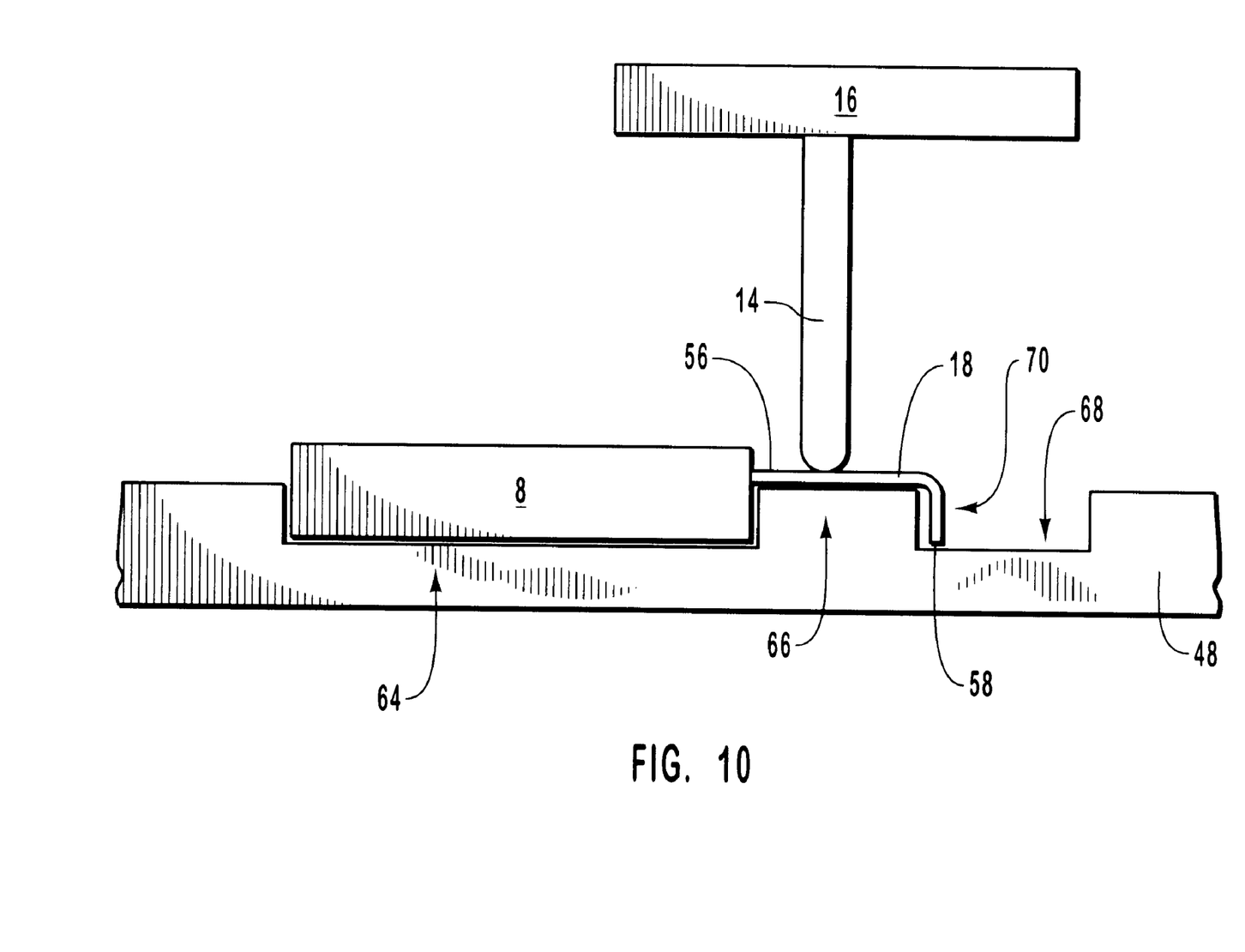
FIG. 10 is an elevational cross-section view of an embodiment of the present invention, wherein a chip package rests within a jig that is configured to substantially support leads that are being contacted under pressure from a tester probe such as a pogo pin.

FIG. 10 is an elevational cross-section view of another embodiment of the present invention, wherein test head 16 tests chip package 8 by making contact with free lead 18 through pogo pin 14. Chip package 8 rests within a chip package jig 48 that includes a jig first recess 64 wherein chip package 8 rests, a jig prominence 66 that substantially supports free lead 18 upon chip package jig 48, and where described, a jig second recess 68 to accommodate a dielectric constraint such as first dielectric constraint 22 seen other Figures, or to accommodate a bent free lead 18 as illustrated.

During testing of chip package 8, pogo pin 14 and free lead 18 are brought into contact with each other and potentially damaging deflection of free lead 18 by pogo pin 14 is substantially resisted by virtue of free lead 18 resting against jig prominence 66. It can be appreciated that chip package 8 may also be tested with an array of constrained leads 20 with variations of the depicted jig 48. In addition to use of a pogo pin, the present invention may use probes developed by Packard-Hughes located at Ivne, Calif., USA, with the registered trademark GOLD DOT® or probes developed by Nitto Denko located at San Jose, Calif., USA.

One advantage of the present invention is that, where leads are contacted at second contact location 52 and free lead 18 or constrained lead 20 at second contact location 52 is to be sheared off after testing such that damage to that portion of the leads is inconsequential as long as the testing is successful, a less costly contacting scheme may be used such as a stamped metal buckle beam mounted in a carrier. Where a robust pogo pin is preferred over other technology, its comparatively lower cost is a favorable factor in testing schemes for chip packages. A stamped metal buckle beam array or the like may be mounted in a plastic carrier, mated to test head 16, alternatively to second test head 46, seen in FIG. 8, and contacted to an array of free leads 18 or constrained leads 20.

Figure 11:
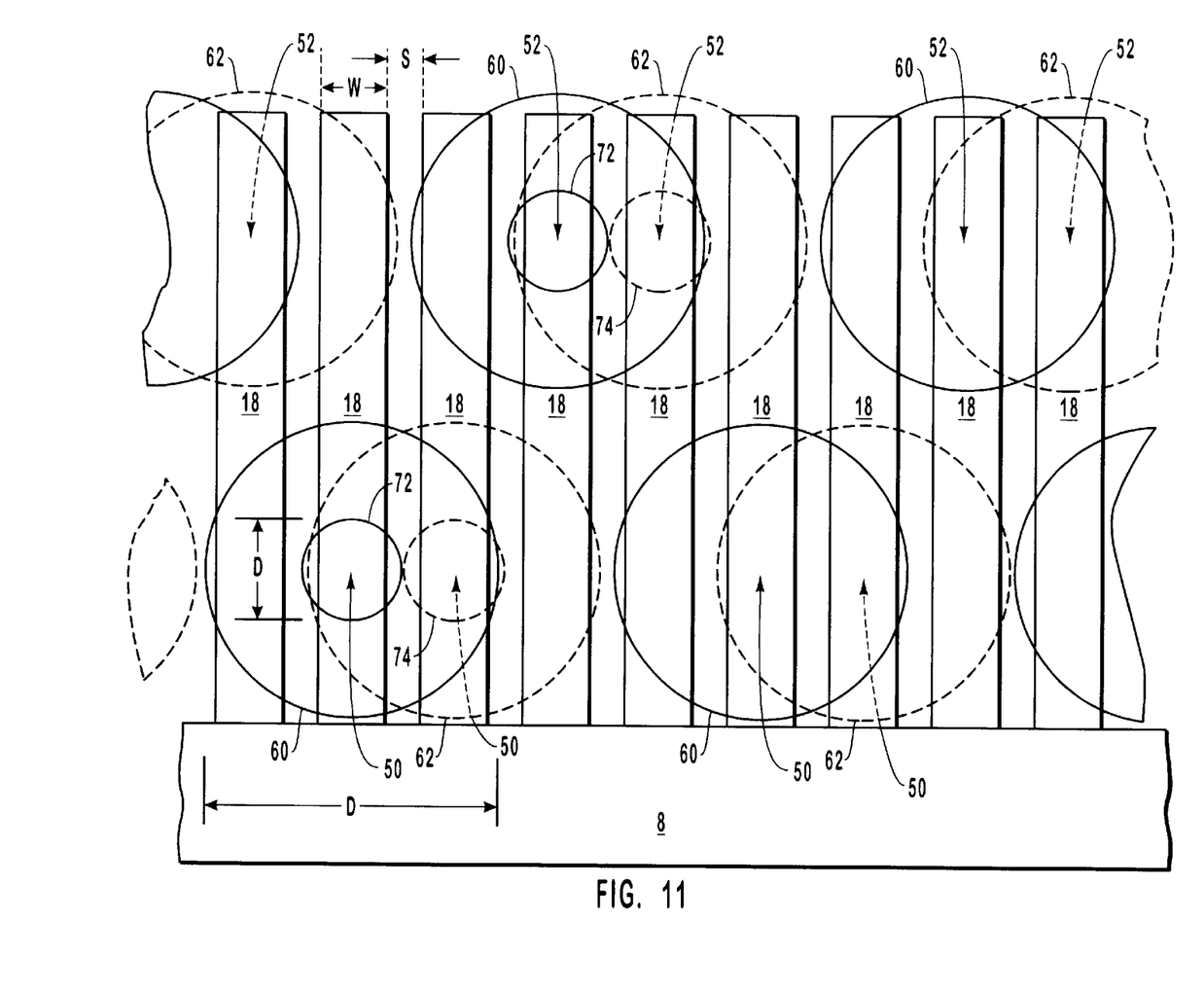
FIG. 11 is a plan view illustration of one embodiment of the present invention, wherein another alternative scheme of contacting leads with an array of pogo pins is carried out, whereby contact with a first lead is made upon a first side and contact with an adjacent second lead is made upon a second side that is opposite to the first side, and wherein on either or both of first or second side the array of pogo pins is densely packed such that the array of pogo pins is staggered.

FIG. 11 illustrates another embodiment of the present invention. In FIG. 11, it can be seen that chip package 8 has an array of free leads 18 extending therefrom. Each of free lead 18 has a width W and is separated by a distance S from at least one other of free lead 18. FIG. 11 illustrates a testing scheme whereby a dual array of testing probes, such as pogo pins 14 are making contact with the array of free leads 18 from a first side, illustrated as contact cross-sectional footprint 60, and from a second side, illustrated as contact cross-sectional footprint from second side 62. In this embodiment, it can be seen that first contact point location 50 occurs both for contact cross-sectional footprint 60 and for contact cross-sectional footprint from second side 62 of separate leads. By the same token, it can be seen that second contact location 52 has made contact by both contact cross-sectional footprint 60 and contact cross-sectional footprint from second side 62 for separate leads. Although it appears that each of contact cross-sectional footprint 60 and contact cross-sectional footprint from second side 62 substantially overlap more than one of free lead 18, in this embodiment the contact such as pogo pin 14 has a tapered tip. The tapered tip of pogo pin 14 may have a shape as set forth above as to angular and/or curvilinear configurations. The substantial surface area of the tip of pogo pin 14 has a width that may be less than W, but not greater than W+2S. Thus the contact cross-sectional "footprints" as illustrated represent the space above and below each of free lead 18 on the first side and second side, respectively.

The actual area of a contact that touches free lead 18 is defined by the relationships of the contact area which may have a diameter that may be less than W, may be greater than W, but may not greater than W+2S. A single example of a possible actual area of contact 72 and an actual area of contact from second side 74 is illustrated in FIG. 11, but it is understood that an actual area of contact 72 and an actual area of contact from second side 74 occurs for each lead 18 that makes contact with cross-sectional footprint 60 and contact cross-sectional footprint from second side 74, respectively.

As seen in FIG. 11, a plurality of leads 18 are provided, each lead 18 having a width W, a separation from another lead by a distance S, a first side opposite a second side, a first end proximal to an associated integrated circuit or chip, and a second end distal therefrom. Each lead 18 also has a first position proximal to the first end, and a second position proximal to the second end. The second end of each lead 18 is constrained in a dielectric medium.

As an illustration of the operation of the process depicted in FIG. 11, it is to be assumed that there are n leads 18, wherein n/4 is an integer, and where each pogo pin 18 has a respective lead 18 and has a first characteristic dimension D, where D>W and D<(W+2S), and each pogo pin 14 has a second characteristic dimension D' that is separated from the first characteristic dimension D. Also assume that the second characteristic dimension D' is located at one end of each pogo pin 14, where D'>W and D'≦(W+2S), and where D is at least 10% greater D'. In use of an embodiment of the invention, a contact is made from each pogo pin 14 or lead probe to a portion of the respective lead 18. In so doing, there is made a contact with a portion of the nth lead to an intersection with the second characteristic dimension D' of the respective pogo pin. The contact with the portion of the nth lead is upon the first side of the nth lead at a first position upon the nth lead.

There is also a contact made with a portion of the nth+1 lead to an intersection with the second characteristic dimension D' of the respective pogo pin, the contact with the portion of the nth+1 lead being upon the second side of the nth+1 lead at the first position of the nth+1 lead, where the nth+1 lead being is adjacent to the nth lead.

A further contact is made with a portion of the nth+2 lead to an intersection with the second characteristic dimension D' of the respective pogo pin, the contact with the portion of the nth+2 lead being upon the first side of the nth+2 lead at the second position of the nth+2 lead, the nth+2 being adjacent to the nth+1 lead.

Yet another contact is made with a portion of the nth+3 lead to an intersection with the second characteristic dimension D' of the respective pogo pin, the contact with the portion of the nth+3 lead being upon the second side of the nth+3 lead at the second position of the nth+3 lead, the nth+3 lead being adjacent to the nth+2 lead.

After contacting the n to the n+3 leads with respective pogo pins 18, the portion of each lead 18 that was contacted by its respective pogo pin 18 is removed, as it may be damaged and it is no longer required.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A chip package comprising:
    an integrated circuit enclosed within a body of insulative material having opposing ends;
    a plurality of leads making electronic contact to said integrated circuit, each said lead having a first end opposite a second end, said first end extending from the body of insulative material;
    a dielectric constraint in which said second end of each said lead is physically constrained, said dielectric constraint being physically connected to the opposing ends of the body of insulative material, wherein a perimeter around the plurality of leads is formed by the body of insulative material and the dielectric constraint.

2. A chip package according to claim 1, wherein each lead of said plurality of leads has an exposed portion, said exposed portion being electrically conductive, said exposed portion comprising a first area for contact testing and a second area for chip package mounting.

3. A chip package according to claim 1, wherein said dielectric constraint is a thermoplastic.

4. A chip package according to claim 1, wherein;
    said plurality of leads includes a first lead and a last lead in sequential order; and
    the first lead and the last lead are parallel to the second structure.

5. A chip package according to claim 1, wherein said chip package comprises a ring pack.

6. A chip package according to claim 1, wherein said chip package comprises a VSMP.

7. A chip package according to claim 1, wherein said chip package comprises a zig-zag surface-mounted package.

8. A chip package according to claim 1, wherein said chip package comprises a dual in-line surface-mounted package.

9. The chip package as defined in claim 1, wherein:
    the dielectric constraint includes first, second and third components;
    each of the first and second components have opposing ends;
    one of the opposing ends of the first and second components contacts the body of insulative material;
    the other of the opposing ends of the first and second components is attached to the third component; and
    the third component does not contact the body of insulative material.

10. The chip package as defined in claim 9, wherein said plurality of leads are surrounded by:
    the body of insulative material; and
    the first, second, and third components.

11. The chip package as defined in claim 9, wherein the first component of the second structure is parallel to the second component of the second structure.

12. A chip package comprising:
    an integrated circuit encapsulated in an encapsulant;
    a plurality of leads making electronic contact to said integrated circuit and extending away from said integrated circuit, each lead having a first end proximal to said integrated circuit, and a second end distal from said integrated circuit, wherein:
    said second end is constrained in a dielectric medium;
    each lead of said plurality of leads has an exposed portion that is electrically conductive and comprises a first area for contact testing and a second area for chip package mounting;
    said dielectric medium has a shape that includes a first structure into which said second end of each said lead is embedded and a pair of second structures that each:

make contact with the encapsulant;
are parallel to each said lead, and are located contiguous to one of:
a first lead of said plurality of leads at a first edge of said integrated circuit; and
a last lead said plurality of leads at a second edge of said integrated circuit opposite said first edge of said integrated circuit.

13. A chip package according to claim 12, wherein said dielectric medium is a thermoplastic.

14. A chip package according to claim 12, wherein said chip package is selected from a group consisting of a VSMP, a zig-zag surface-mounted package, and a dual in-line surface-mounted package.

15. A chip package comprising:
a lead making electronic contact to an integrated circuit, wherein the lead:
extends away from said integrated circuit;
has a first side opposite a second side;
has a first end proximal to said integrated circuit; and
has a second end distal from said integrated circuit, wherein said second end is constrained in a dielectric medium;
an encapsulant encapsulating the integrated circuit and the first end of the lead; wherein:
the encapsulant is physically attached to the dielectric medium so as to form a continuous closed perimeter around the lead;
the lead has an exposed portion that is electrically conductive and comprises a first area for contact testing and a second area for chip package mounting; and
the dielectric medium has a shape that includes a first structure into which the second end of the lead is embedded and a second structure that is parallel to the lead.

16. A chip package according to claim 15, wherein said dielectric medium is a thermoplastic.

17. An insulated electrical circuit comprising:
a microchip;
an encapsulant encapsulating the microchip and having opposite ends;
a dielectric constraint attached at the opposite ends of the encapsulant;
a plurality of electrical leads in electrical communication with the microchip, each protruding from the encapsulant and the dielectric constraint at opposing ends thereof; wherein:
a perimeter is formed around said plurality of leads the encapsulant and the dielectric constraints;
said plurality of leads includes a first lead and a last lead in sequential order; and
the first lead and the last lead are parallel to a portion of the dielectric constraint.

18. An insulated electrical circuit comprising:
a microchip;
an encapsulant encapsulating the microchip;
an electrical lead in electrical communication with the microchip;
a dielectric constraint connected at an end of the electrical lead opposite the encapsulant; and
a stabilizing structure attaching the dielectric constraint to the encapsulant.

19. The insulated electrical circuit as defined in claim 18, wherein:
the stabilizing structure is composed of an electrical insulative material; and
a perimeter is formed around the electrical lead by the encapsulant, the dielectric and the stabilizing structure.

20. The insulated electrical circuit as defined in claim 18, further comprising a plurality of said electrical lead each:
contacting at respective ends thereof the encapsulant and the dielectric constraint; and
not making contact with the stabilizing structure.

21. The insulated electrical circuit as defined in claim 20, wherein:
said plurality of leads includes a first lead and a last lead in sequential order; and
the first lead and the last lead are parallel to the stabilizing structure.

22. An insulated electrical circuit comprising:
a microchip;
an encapsulant encapsulating the microchip;
a dielectric constraint separated from the encapsulant;
a stabilizer structure attaching the encapsulant to the dielectric constraint;
a plurality of leads each being:
situated within a perimeter formed by the encapsulant, the dielectric constraint, and the stabilizer structure;
electrically connected to the microchip; and
in contact with the encapsulant and the dielectric constraint at respective ends of the lead.

23. The insulated electrical circuit as defined in claim 22, wherein:
said plurality of leads includes a first lead and a last lead in sequential order; and
the first lead and the last lead are parallel to the stabilizing structure.

24. An insulated electrical circuit comprising:
a microchip;
an encapsulant encapsulating the microchip;
a plurality of electrical leads each in electrical communication with the microchip and protruding from the encapsulant to terminate at an end;
a dielectric constraint having first, second and third components, wherein:
the first component does not make contact with the second component;
the third component attached to the end of each said electrical lead and does not make contact with the encapsulant;
the first and second components make contact with the encapsulant; and
the encapsulant and the dielectric constraint form a perimeter around the plurality of leads.

25. The insulated electrical circuit as defined in claim 24, wherein:
said plurality of leads includes a first lead and a last lead in sequential order; and
the first lead and the last lead are parallel to the first and second components of the dielectric constraint.

* * * * *

UNITED STATES PATENT AND TRADEMARK OFFICE
CERTIFICATE OF CORRECTION

PATENT NO.   : 6,172,413 B1
DATED        : January 9, 2001
INVENTOR(S)  : Warren M. Farnworth Page 1 of 1

It is certified that error appears in the above-identified patent and that said Letters Patent is hereby corrected as shown below:

Column 5,
Line 48, before "footprint" change "cross-Page sectional" to -- cross-sectional --

Column 6,
Line 10, after "width" change "Wand" to -- W and --
Line 18, before "opposite sides" change "alternatingly" to -- alternatingly --
Line 47, before "when each" change "usefull" to -- useful --

Column 7,
Line 18, delete hyphen after "contact"
Line 44, before "preferably" change "derometers, to -- durometers, --
Line 44, after "about 20" change "derometers" to -- durometers --
Line 45, before "more preferably" change "durometer," to -- durometers, --
Line 45, after "about 30" change "derometers" to -- durometers --
Line 46, after "about 40" change "derometers." to -- durometers. --
Line 47, after "about 35" change "durometer." to -- durometers. --

Column 8,
Line 5, after "portion of" change "coined" to -- constrained --
Line 17, before "a jig" change "described," to -- desired, --
Line 26, after "pogo" change "pin,the" to -- pin, the --
Line 27, after "located at" change "Ivne," to -- Irvine, --

Signed and Sealed this

Eighteenth Day of December, 2001

*Attest:*

*Attesting Officer*

JAMES E. ROGAN
*Director of the United States Patent and Trademark Office*